(12) United States Patent
Pehlke et al.

(10) Patent No.: US 6,566,944 B1
(45) Date of Patent: May 20, 2003

(54) CURRENT MODULATOR WITH DYNAMIC AMPLIFIER IMPEDANCE COMPENSATION

(75) Inventors: David R. Pehlke, Chapel Hill, NC (US); Aristotele Hadjichristos, Apex, NC (US); William O. Camp, Jr., Chapel Hill, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 10/080,239

(22) Filed: Feb. 21, 2002

(51) Int. Cl.[7] .............................................. H03F 3/38
(52) U.S. Cl. ......................................... 330/10; 330/136
(58) Field of Search ............ 330/10, 136; 332/159–162

(56) References Cited

U.S. PATENT DOCUMENTS

| | | | | |
|---|---|---|---|---|
| 5,929,702 A | * | 7/1999 | Myers et al. ................. | 330/10 |
| 6,300,826 B1 | * | 10/2001 | Mathe et al. ................. | 330/10 |
| 6,351,189 B1 | * | 2/2002 | Hirvilampi .................. | 330/296 |
| 6,407,639 B1 | * | 6/2002 | Jean et al. ................... | 330/298 |

* cited by examiner

*Primary Examiner*—Robert Pascal
*Assistant Examiner*—Khanh Van Nguyen
(74) *Attorney, Agent, or Firm*—Coats & Bennett, P.L.L.C.

(57) ABSTRACT

An amplitude modulation circuit (modulator) provides modulated supply current, possibly in combination with modulated supply voltage, to a radio frequency (RF) power amplifier (PA), and includes a detection circuit responsive to changes in the ratio of that voltage to the modulated supply current, described herein as its AM modulation impedance. Such impedance (resistance) changes commonly arise from changing coupling characteristics at the RF antenna assembly driven by the PA. A gain control circuit may be associated with the detection circuit, and made responsive thereto, thus allowing adjustment of modulation gain control responsive to changes in PA AM modulation impedance. In one embodiment, this arrangement permits the modulator to hold a fixed modulation gain over changing PA AM modulation impedance, while in other embodiments, modulation gain varies in response to PA impedance changes to avoid signal clipping. Such clipping might otherwise occur where current modulation values in combination with increased PA resistance would result in PA voltages exceeding the supply voltage of the PA.

68 Claims, 9 Drawing Sheets

CURRENT MODULATOR WITH DYNAMIC AMPLIFIER IMPEDANCE COMPENSATION

BACKGROUND OF THE INVENTION

The present invention generally relates to power amplifier current modulation, and particularly relates to inferentially sensing changes in power amplifier resistance.

Various techniques exist for generating radio frequency transmit signals used in wireless communication systems. These various approaches each entail advantages and disadvantages, but one consideration that is of significant importance with regard to mobile communication devices is the need for relatively good operating efficiency. Operating efficiency is generally a significant factor in the battery life of mobile communication devices. Power amplifier efficiency is a primary factor in overall operating efficiency because the power amplifier circuits used to generate radio frequency (RF) transmit signals are primary consumers of power in such devices.

One technique used to gain power amplifier efficiency involves polar modulation where phase and amplitude modulation information representing desired transmit data are separated into an amplitude modulation signal and a phase modulation signal. The phase modulation signal is generated as a constant-envelope signal applied to the amplification input of the power amplifier. The power amplifier is operated in saturated mode, which yields significant gains in operating efficiency but prevents linear amplification of variable amplitude input signals. To impart linear amplitude modulation to the output signal from the power amplifier, its supply voltage or supply current is modulated in accordance with the desired amplitude modulation information. This yields a time varying RF output signal from the amplifier having both phase and amplitude modulation information.

Supply voltage modulation is relatively straightforward, and involves the use of a voltage modulator to modulate amplifier supply voltage responsive to a controlling amplitude modulation signal. While relatively straightforward, supply voltage modulation is sometimes undesirable where power amplifier non-linearity is encountered due to, for example, transistor turn-on voltage offsets.

Supply current modulation offers superior linearity but is not without its attendant challenges. For example, the power amplifier has low frequency "AM modulation impedance" such that supply current modulations produce a resultant power amplifier operating voltage that swings within a nominal operating range. However, the actual amplifier impedance (resistance) seen by the modulated supply current varies as a function of its RF output impedance coupling. Thus, as the coupling characteristics of the transmit antenna change, the operating voltage resulting from the modulated supply current can vary dramatically. As the affected AM modulation impedance of the power amplifier increases, its operating voltage may rise up to supply limits, beyond which the RF output signal is clipped. Such clipping causes potentially significant non-linearity resulting in a host of undesirable effects including increased adjacent channel signal interference and higher communication bit error rates.

While some conventional systems employing current modulation attempt to compensate for power amplifier impedance changes, existing approaches rely on the use of dissipative sense elements, such as transmission line couplers, to detect RF output signal power. These existing approaches waste transmit signal power, and therefore reduce operating efficiency.

BRIEF SUMMARY OF THE INVENTION

The present invention provides a method and apparatus to dynamically compensate for changing power amplifier impedance in conjunction with providing amplitude modulated supply current to the power amplifier. This dynamic compensation is based on inferentially sensing changes in the DC resistance of the power amplifier arising from changes in power amplifier impedance associated with, for example, changes in transmit antenna coupling. Changes in power amplifier AM modulation impedance, such as changes in power amplifier output impedance, are inferred from the power amplifier operating voltage and a reference current maintained in fixed proportion to the modulated supply current into the power amplifier. This approach yields accurate sensing of changes in power amplifier impedance but without the need for using dissipative components, such as directional couplers, in either the current supply path or RF output signal path of the power amplifier.

A current modulator according to some embodiments of the present invention inferentially senses power amplifier output impedance (PA resistance) to dynamically adjust a control gain used in generating the scaled reference current to maintain a fixed overall amplitude modulation gain between an amplitude modulation signal and the resultant modulated supply current. With this approach, modulation gain may be maintained over a relatively wide range of changing PA resistance. An exemplary approach used in these embodiments involves varying a gain control resistance within a modulation control feedback loop responsive to inferentially sensed PA resistance.

Alternatively, gain control may be used to vary the gain responsive to changing PA resistance to avoid voltage clipping arising from driving the modulated supply current into an increasing PA resistance. That is, the modulation gain may be reduced as the PA resistance increases to avoid driving the operating voltage of the power amplifier to the voltage limits of the current modulator. Gain control may involve the use of a variable resistance, or may involve translating the inferentially sensed PA resistance into adjustments of the modulation signal driving the current modulator. Such adjustments might be made in the analog or digital domains, or in both.

In still other embodiments, matching network impedance is adjusted responsive to the inferentially sensed PA resistance to compensate for changes in transmit antenna coupling. In these configurations, the RF output signal from the power amplifier couples to the transmit antenna through a variable matching network that can be adjusted to maintain impedance matching over a range of impedances. By maintaining impedance matching between the RF output and the transmit antenna, reflected RF power is maintained at a nominal voltage standing wave ratio (VSWR) value, and the current modulator providing the modulated supply current "sees" an essentially constant PA resistance looking into the supply input of the power amplifier.

DETAILED DESCRIPTION OF THE INVENTION

Figure 1:
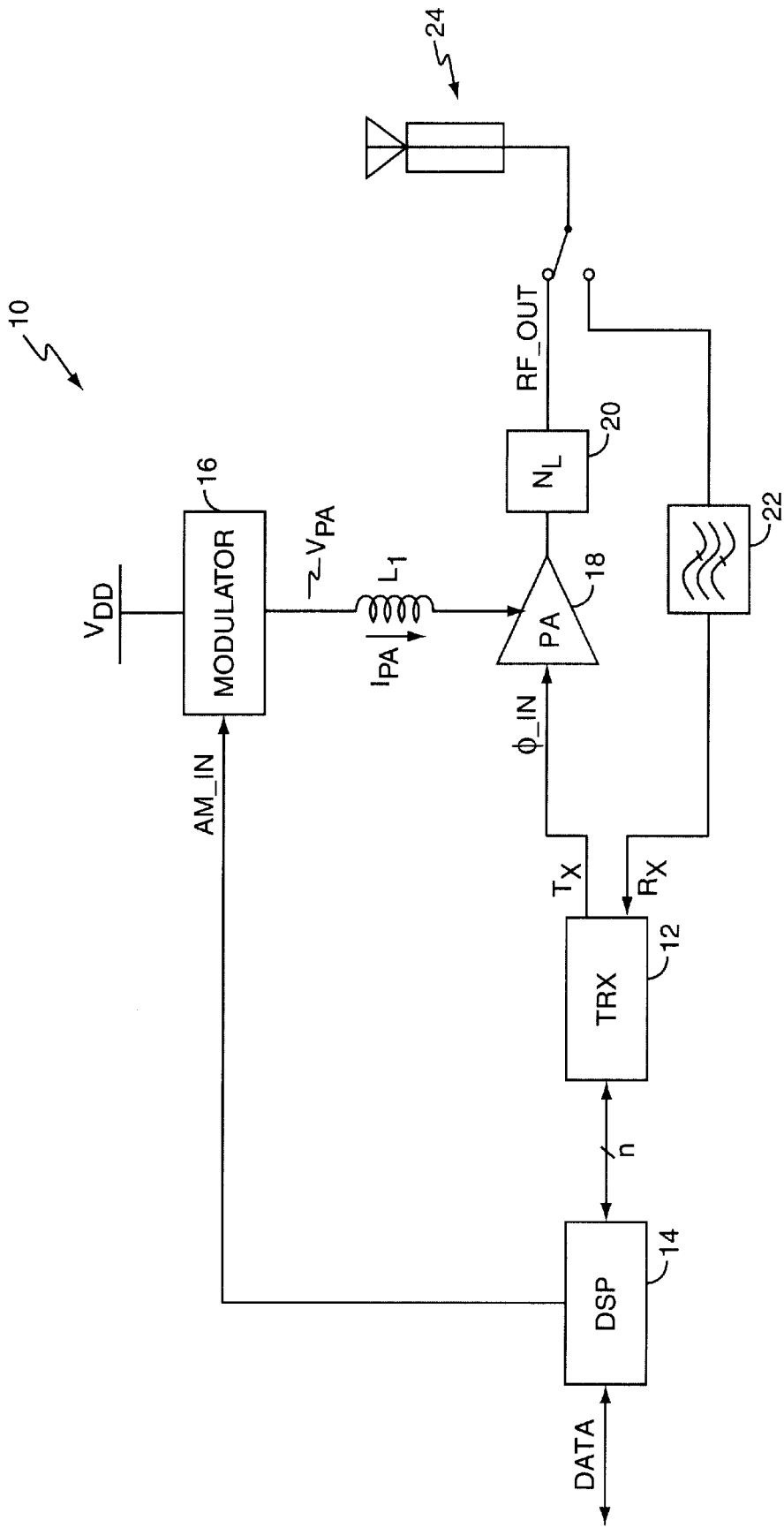
FIG. 1 is a diagram of a conventional wireless communication device employing power amplifier supply current modulation.

FIG. 1 illustrates a wireless communication device 10 employing a conventional current modulator. The device 10 comprises a transceiver 12, a digital signal processor (DSP) 14, a current modulator 22, and an antenna assembly 24. In operation, the transceiver 12 provides a constant envelope, phase modulated input signal to the power amplifier 18 based on desired transmit data received from the DSP 14. Additionally, the DSP 14 generates an amplitude modulation signal that drives modulator 16. In turn, modulator 16 generates a modulated supply current $I_{PA}$, which serves as the input supply current to the power amplifier 18. The power amplifier 18 is operated in saturated mode such that the modulated supply current driven into the power amplifier output impedance generates amplitude modulations in the RF output signal from the power amplifier 18. Consequently, the RF output signal includes both phase and amplitude modulation information corresponding to the desired transmit data.

Figure 2:
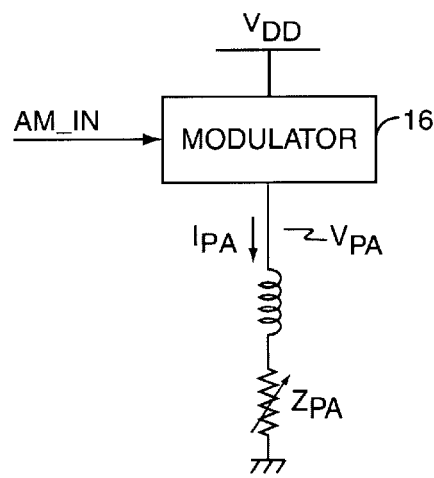
FIG. 2 is a diagram of the current modulator of FIG. 1.

FIG. 2 depicts the modulator 16 in relation to a simplified representation of the power amplifier 18. Here, the power amplifier 18 is represented from the perspective of the modulator 16 as a variable impedance load $Z_{PA}$. Changes in $Z_{PA}$ arise because of, among other things, changes in the coupling environment relative to the antenna assembly 24. That is, the radiated signal from the antenna is coupled into the surrounding environment differently depending upon the nature and proximity of external objects relative to the antenna assembly 24. As the effective impedance of the antenna assembly 24 changes, so too does the impedance matching between the output matching network 20 and the antenna assembly 24. As those skilled in the art will readily appreciate, impedance mismatches between the matching network 20 and the antenna assembly 24 result in voltage standing wave ratio (VSWR) changes, which effectively changes the output impedance of the power amplifier 18 as seen by the modulator 16.

The changing impedance results in different operating voltages at the supply input of the power amplifier 18 for a given magnitude of modulated supply current. That is, the modulated supply current results in differing operating voltages as the power amplifier AM modulation impedance increases or decreases with changing output impedance. One consequence of this phenomenon is that if the power amplifier impedance increases too much, the output signal from the power amplifier 18 may be voltage clipped where the instantaneous magnitude of the modulated supply current driving the power amplifier 16 would result in a voltage exceeding the voltage limits of the modulator 16. For example, if the modulator 16 derives the modulated supply current from a battery or other supply source within device 10, the magnitude of that voltage source limits the operating voltage of the power amplifier 18 by limiting the voltage into which the modulator 16 can drive the modulated supply current.

Figure 3A:
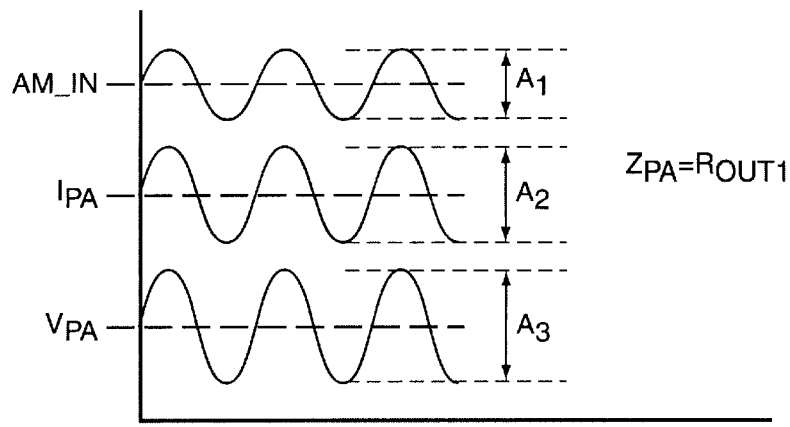
FIGS. 3A and 3B are graphs illustrating power amplifier output signal voltage clipping where changes in power amplifier resistance are not compensated.
Figure 3B:
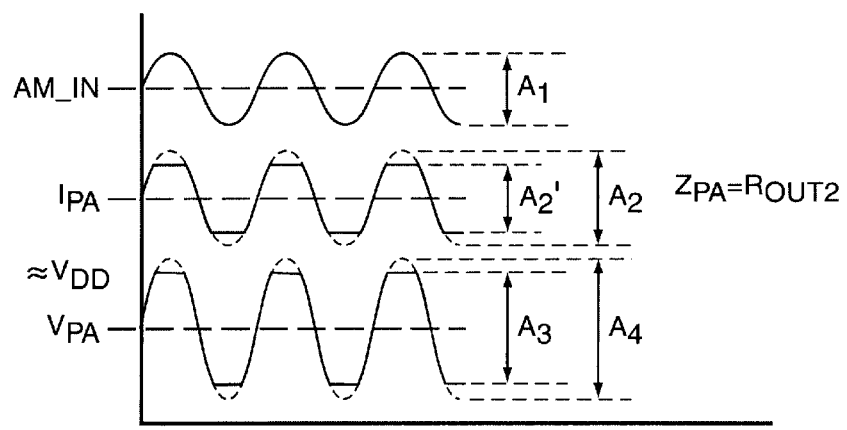

FIGS. 3A and 3B illustrate the consequences of this voltage clipping phenomena. In FIG. 3A, impedance matching between the matching network 20 and the antenna 24 is assumed nominal, giving the power amplifier 18 an effective DC resistance equal to a nominal value, $R_{OUT1}$. The amplitude modulation signal AM_IN has a peak-to-peak amplitude A1, and the modulator 16 produces modulated supply current $I_{PA}$ at a peak-to-peak amplitude A2 based on a given modulation gain. The modulated supply current driven into the supply input of power amplifier 16 generates a resultant operating voltage $V_{PA}$ having a peak-to-peak magnitude A3 dependent on the value of $R_{OUT1}$. As $R_{OUT1}$ is at the nominal value, the magnitude of the operating voltage $V_{PA}$ remains within voltage limits.

In FIG. 3B, impedance mismatch arising from changes in external signal coupling relative to antenna assembly 24 causes the effective DC resistance of the power amplifier 18 to increase from $R_{OUT1}$ to $R_{OUT2}$. The operating voltage $V_{PA}$ that would result from driving the modulated supply current into $R_{OUT2}$ exceeds operating limits, therefore the output signal exhibits clipping at the voltage limits. Thus, rather than driving to a peak-to-peak amplitude A4, the output signal is clipped at amplitude A3. This clipping causes distortion in the output signal, which increases adjacent-channel interference and bit error rates at the receiving system.

Figure 4:
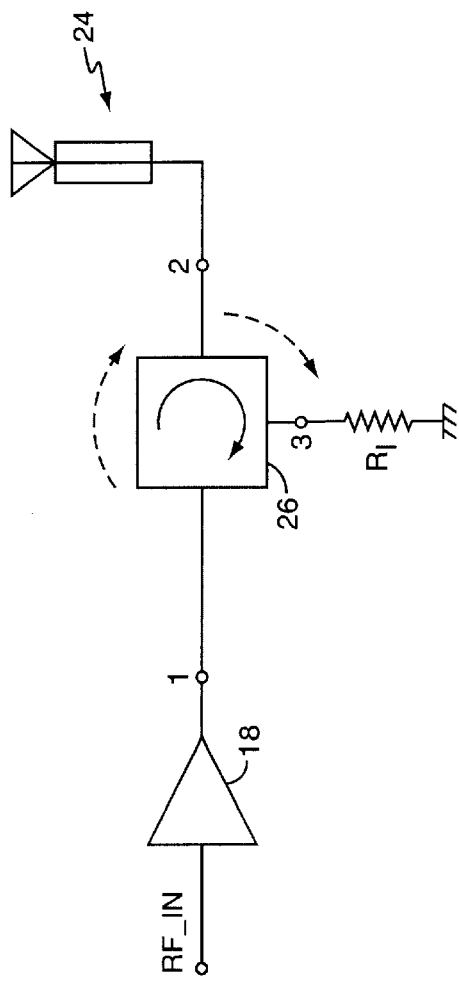
FIG. 4 is a diagram of an impedance isolator as conventionally used to isolate the power amplifier from changing output impedance.
Figure 5:
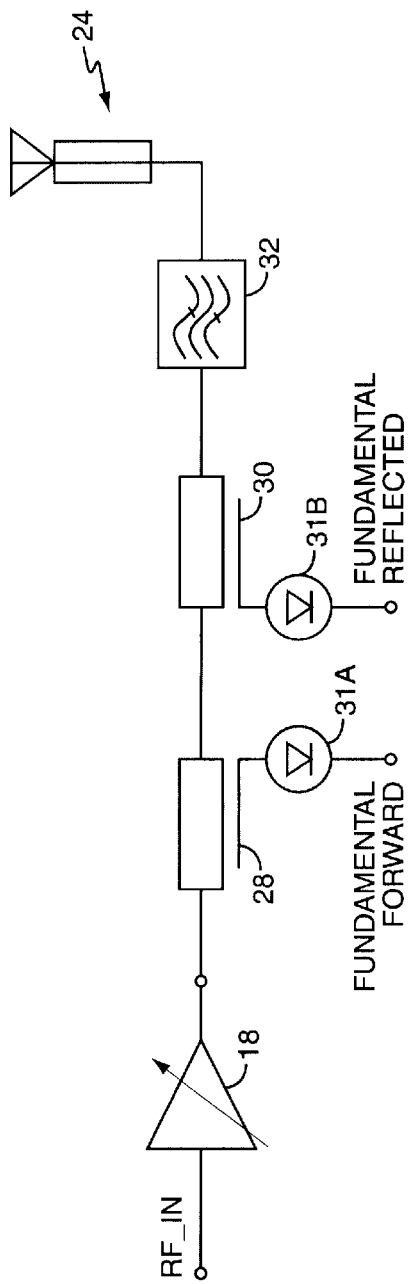
FIG. 5 is a diagram of paired directional couplers that are conventionally used to sense fundamental and reflected power from the power amplifier.

FIGS. 4 and 5 illustrate conventional approaches to the impedance mismatch problem in the context of power amplifier current modulation. In FIG. 4, the output of the amplifier 18 is coupled to the antenna assembly 24 through an isolator 26. The isolator 26 functions as a three-port network, and shields the power amplifier 18 from changes in antenna assembly impedance by transferring reflected power arising from impedance mismatch into a load $R_l$ rather than back into the output of power amplifier 18. While this approach is effective in terms of simulating fixed output impedance from the perspective of the modulator 16, it is inefficient in that actual output impedance mismatches still exist, and result in potentially significant power dissipation associated with the reflected energy being dissipated in the load resistor R.

The approach illustrated in FIG. 5 also suffers from the inefficiencies associated with having dissipative elements either in the modulated supply current path or in the output signal path of the power amplifier 18. Here, directional couplers 28 and 30 in combination with AM detection diodes 31A and 31B, detect fundamental forward and fundamental reflected powers, respectively. By sensing the difference between these two powers, a controlling system might vary the gain of the power amplifier 18, or otherwise compensate the RF input signal to avoid problems associated with changing power amplifier output impedance. Again, such compensation is at the expense of potentially significant power dissipation associated with sensing the power amplifier output impedance.

Figure 6:
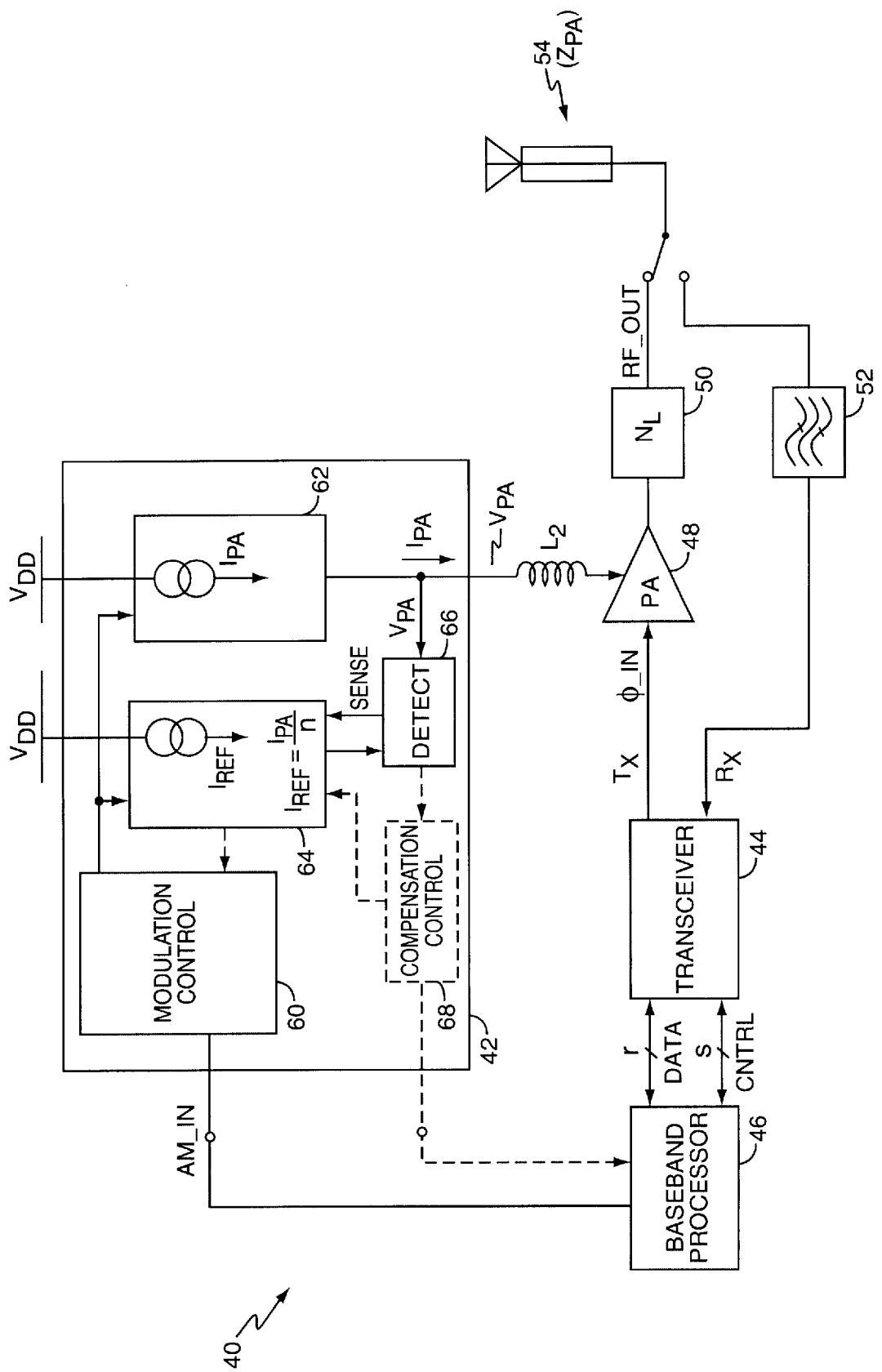
FIG. 6 is a diagram of an exemplary wireless communication device, including an exemplary embodiment of a current modulator according to the present invention.

FIG. 6 illustrates an exemplary approach to inferentially sensing power amplifier output impedance (e.g., inferentially sensing DC resistance) using techniques that avoid placing dissipative elements in either a modulated supply current path or a power amplifier output signal path. Inferential sensing may be bandwidth adjusted as needed to achieve as sensing frequency suitable for the application at hand. For example, as the resultant operating voltage of the power amplifier 48 varies with the magnitude of the modulated supply current from current modulator 42, its apparent impedance changes. Thus, inferential sensing may be made responsive to quickly changing amplifier impedance at the amplitude modulation frequency, in addition to the relatively slower impedance changes arising from changing coupling characteristics of the antenna assembly 54.

Here, an exemplary wireless communication device 40 includes a current modulator 42 configured according to the present invention. In this embodiment, the current modulator 42 comprises a modulation control circuit 60, an output circuit 62, a reference circuit 64, a detection circuit 66, and, optionally, a compensation controller 68. In addition to the current modulator 42, the device 40 includes a transceiver 44, a baseband processor 46, a power amplifier 48, a matching network 50, a receive filter 52, and an antenna assembly 54.

In operation, the output circuit 62 of the current modulator 42 provides a modulated supply current to a supply input of the power amplifier 48 responsive to the amplitude modulation signal AM_IN at a desired modulation gain. The baseband processor 46 may or may not generate the AM_IN similar to the amplitude modulation signal shown in the conventional device 10. In any case, the modulation control circuit 60 generates a modulation control signal linearly responsive to the amplitude modulation signal, and this modulation control signal drives the generation of the reference current generated by the reference circuit 64, and the modulated supply current generated by the output circuit 62.

The reference circuit generates the reference current proportional to the modulated supply current, and includes a reference control element (shown later) that maintains the reference current in fixed proportion to the modulated supply current responsive to an inferential sense signal generated by the detection circuit 66. The detection circuit 66 generates the inferential sense signal as a function of the operating voltage $V_{PA}$ of the power amplifier 48, and the reference current. Thus, the inferential sense signal is generated as a function of the AM modulation impedance of the power amplifier 48.

In its various embodiments, inferential sensing of power amplifier AM modulation impedance may be used to, among other things, effect gain control such that modulation gain is maintained over changing power amplifier AM modulation impedances. In other embodiments, the modulation gain is varied over changing power amplifier AM modulation impedances to prevent voltage clipping of the RF output signal. In still other embodiments, inferential sensing is used to vary a matching impedance network, thereby maintaining impedance matching between the power amplifier 48 and the antenna assembly 54 over changing conditions. This last approach effectively cancels out the impedance changes of the antenna assembly 54, but does so without dissipating RF power. Other applications of the inferential sensing method will be apparent to those skilled in the art. Indeed, in all cases, the current modulator 42 provides device 40 with the ability to sense changes in power amplifier AM modulation impedance without introducing additional dissipative elements into either the modulator current supply path or the RF output signal path.

Figure 7:
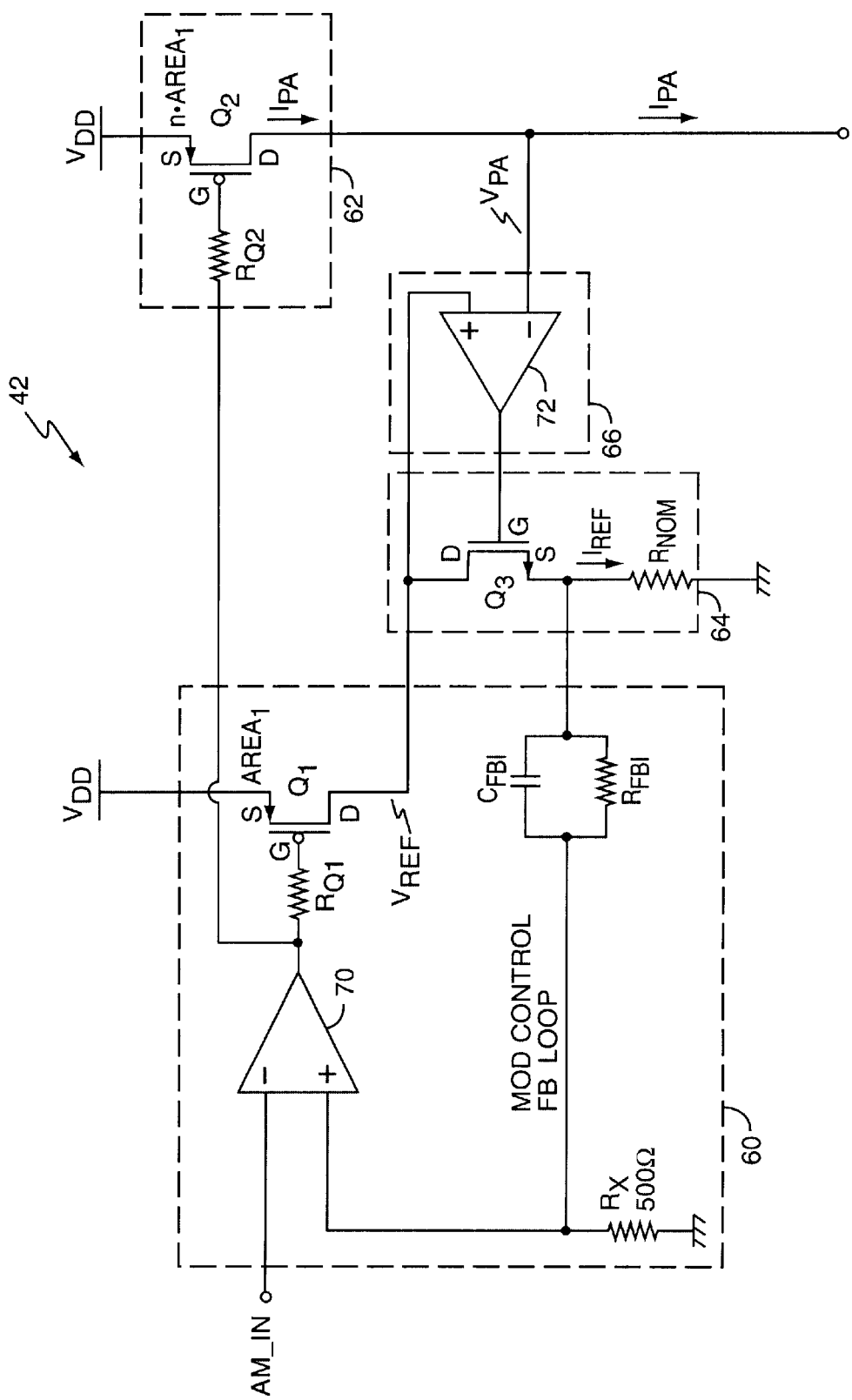
FIG. 7 is a diagram illustrating an exemplary embodiment of the current modulator of FIG. 6 where a control gain is varied responsive to inferentially sensed PA resistance to maintain modulation gain.

FIG. 7 illustrates exemplary details for an embodiment of the current modulator 42, wherein inferential impedance sensing is used to maintain a constant modulation gain over changing power amplifier output impedances. Here, the modulation control circuit 60 comprises a differential amplifier 70, a field effect transistor (FET) Q1, and a feedback loop closed around the reference circuit 64. The modulation control circuit 60 generates a modulation control signal that drives the gates of transistors Q1 and Q2, with transistor Q2 serving as the output transistor of the output circuit 62. Here, one notes that the gates of Q1 and Q2 are driven by the modulation control signal through series resistors $R_{Q1}$ and $R_{Q2}$, respectively. Imposing series resistance in this fashion yields frequency compensation arising from the filtering effect of the series resistance in combination with the input gate capacitance of Q1 and Q2. The values of $R_{Q1\ and\ RQ2}$ may be adjusted individually to achieve the desired frequency response, or $R_{Q1}$ and $R_{Q2}$ may be combined as a common resistor on the output of amplifier 70, such that the gates of Q1 and Q2 are driven through a common series resistor.

Closed-loop control is used to insure that the modulation control signal is generated linearly responsive to the amplitude modulation signal AM_IN. In this embodiment, the modulation control circuit 60 closes its feedback control loop through the reference circuit 64. More particularly, a feedback voltage of the differential amplifier 70 is derived from an operating voltage $V_{REF}$ in the reference circuit 64, and the differential amplifier 70 generates the modulation control signal based on the difference between the input amplitude modulation signal and the feedback voltage from the reference circuit 64. The feedback loop of amplifier 70 includes the parallel combination of $R_{FBI}$ and $C_{FBI}$, which allows tuning of its frequency response. More particularly, the use of $C_{FBI}$ permits a lower gain at higher frequencies, yielding improvements in the control response of modulation control circuit 70 relative to changes in inferentially sensed impedance changes at the power amplifier 48. Of course, those skilled in the art will appreciate that the particular values of $R_{FBI}$ and $C_{FBI}$ depends on the desired operating frequencies of the current modulator 42, the frequency response of the various amplifiers used, etc.

As will be explained in more detail later, the reference circuit 64 maintains the reference operating voltage $V_{REF}$ at the drain of Q1 to be equal to drain voltage of the output transistor Q2, such that Q1 and Q2 are maintained at the same operating condition. Note that in this embodiment, the drain voltage of Q2 is at the operating voltage $V_{PA}$ of the power amplifier 48 as detected by the detection circuit 66. Thus, the reference operating voltage VREF applied to the drain of Q1 is maintained at the operating voltage $V_{PA}$, and is therefore responsive to changes in power amplifier AM modulation impedance. Thus the feedback voltage applied to amplifier 70 is responsive to changes in power amplifier AM modulation impedance. As such, in this embodiment, a control gain of the modulation control circuit 60 is varied responsive to changes in power amplifier AM modulation impedance to maintain an essentially constant modulation gain of the modulated supply current relative to the amplitude modulation signal.

The ability to accurately infer power amplifier AM modulation impedance depends on maintaining a constant proportionality between the reference current and the modulated supply current. That is, if the actual operating voltage $V_{PA}$ of the power amplifier 48 is known, then the power amplifier AM modulation impedance may be inferred from the reference current, provided that the scaling factor relating the reference current $I_{PA}$ to the modulated supply current $I_{PA}$ is known. Because the output transistor Q2 has a precisely scaled geometry relative to transistor Q1, e.g., n×AREA$_1$, if Q1 is maintained at the same operating condition as Q2, then the current conducted through Q1 will have a known proportionality to the current conducted through Q2. Thus, Q1 serves as reference transistor for generating the reference current with a precise scaling relative to the modulated supply current.

Here, the gates of Q1 and Q2 are both driven by the modulation control signal from amplifier 70, and the sources of both are commonly tied to supply voltage $V_{DD}$. Thus, the gate-to-source voltage of Q1 equals that of Q2. If the drain voltages of Q1 and Q2 are made equal, then the source-to-drain voltages of Q1 and Q2 will be equal and both transistors Q1 and Q2 will have identical operating conditions. Maintaining reference operating voltage $V_{REF}$ equal to the power amplifier operating voltage $V_{PA}$ ensures that Q1 has the same operating condition as Q2. In turn, maintaining the same operating conditions between Q1 and Q2 ensures that the reference current $I_{REF}$ through Q1 will have the expected proportionality relative to the modulated supply current $I_{PA}$ flowing through Q2.

Because the drain of Q2 is at the operating voltage $V_{PA}$ of the power amplifier 48, or is otherwise dependent on $V_{PA}$, Q2's drain voltage varies as a function of power amplifier AM modulation impedance. Thus, the detection circuit drives control transistor Q3 of the reference circuit 64 to maintain the drain of Q1 at $V_{PA}$ by varying the voltage drop across Q3 responsive to changes in $V_{PA}$. Thus, control transistor Q3 functions as the reference control element mentioned in the discussion of FIG. 6. Effectively, control transistor Q3 operates as a voltage-controlled resistance responsive to changes in power amplifier AM modulation impedance.

Control of Q3 is maintained in closed-loop fashion by the detection circuit 66, which comprises a differential amplifier 72 having a sensing input coupled to the operating voltage $V_{PA}$, and a feedback input coupled to the drain of Q1. Thus, amplifier 72 outputs an inferential sense signal used to drive the gate of Q3, thereby varying the resistance seen by the reference current up or down to maintain the drain of Q1 at the operating voltage $V_{PA}$. Thus, the reference current $I_{REF}$, which is a known fraction of the modulated supply current $I_{PA}$, is driven into a variable resistance $R_{REF}$ at the operating voltage $V_{PA}$. In this manner, the inferential sense signal reflects the power amplifier AM modulation impedance based on, $$I_{REF} = \frac{V_{PA}}{R_{REF}} = \frac{V_{PA}}{n \cdot R_{PA}} \quad (1)$$

where $R_{REF}=R(Q3)+R_{NOM}$, $I_{REF}=I_{PA}/n$, and the feedback voltage of modulation control circuit 60=$V_{PA}-I_{REF} \times R(Q3)$.

Figure 8:
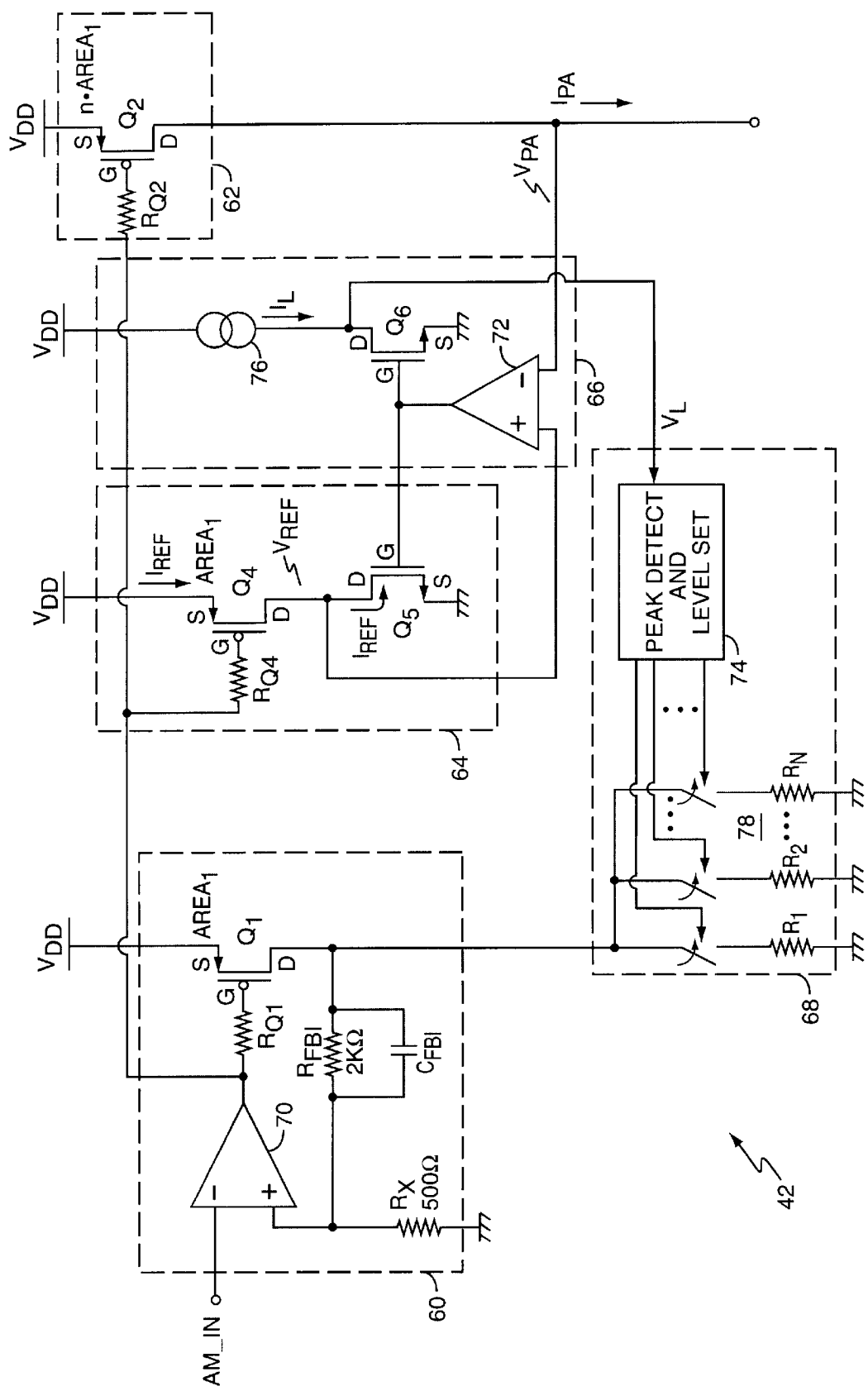
FIG. 8 is a diagram illustrating another exemplary embodiment of the current modulator where the modulation gain is varied responsive to inferentially sensed PA resistance to avoid voltage clipping.

While the current modulator 42 in FIG. 7 offers the advantages of inferential AM modulation impedance sensing, it does not make provisions for the prevention of voltage clipping arising from excessive impedance mismatch between the power amplifier 48 and the antenna assembly 54. FIG. 8 illustrates a current modulator 42 with many similarities to that shown in FIG. 7, but with the addition of voltage clipping control. Here, the control loop of the modulation control circuit 60 is not closed around the reference circuit 64, but rather is closed through the compensation controller 78, which operates to vary the control gain of the modulation control circuit 60 responsive to changes in power amplifier AM modulation impedance. More particularly, if the effective DC resistance of the power amplifier 48 increases to the point where voltage clipping of the power amplifier's RF_OUT signal would occur, the detection circuit 66 and the compensation controller 68 cooperate to adjust the modulation gain of the current modulator 42 to avoid such clipping.

In this embodiment, transistor Q1 has the same scaling relationship relative to output transistor Q2, but here a second scaled transistor, Q4, is included in the reference circuit 64 as the reference transistor. The gates of transistors Q1, Q2, and Q4 are driven by the modulation control signal, with Q1 driving a modulated current into a load of the compensation controller 68 which is variable in discrete steps, effectively making the modulation gain of the current modulator 42 dependent on the load presented by the compensation controller 68. The gate inputs of Q1, Q2, and Q4 include series compensation resistors $R_{Q1}$, $R_{Q2}$, and $R_{Q4}$, respectively, for frequency compensation as described earlier. Again, individual gate resistors may be used as shown, or a single series resistor may be used on the output of amplifier 70, with all gates commonly connected to the output of that single resistor.

Reference transistor Q4 drives the reference current $I_{REF}$ into transistor Q5, which here operates as the reference control element that, responsive to the inferential sense signal from detection circuit 66. Operation of transistor Q5 responsive to the inferential sense signal from detection circuit 66 maintains the reference operating voltage $V_{REF}$ on the drain of reference transistor Q4 at the operating voltage appearing on the drain of Q2. Thus, the reference operating voltage $V_{REF}$ is slaved to the operating voltage $V_{PA}$ of the power amplifier. Here, the drain voltage of Q2 equals the operating voltage $V_{PA}$ of the power amplifier 48. Thus, as in the circuit of FIG. 7, the reference current $I_{REF}$ through Q4 is maintained at a known proportionality to the modulated supply current $I_{PA}$ sourced from output transistor Q2 of the output circuit 62.

Detection circuit 66 includes the differential amplifier 72 operating Q5 as a voltage-controlled resistance similar to the discussion above, and further includes a current source 76, and a second transistor Q6. Current source 76 generates a fixed current $I_L$. Because the input impedance looking into the compensation controller 68 is high, essentially all of the current $I_L$ flows into transistor Q6. Thus, the voltage $V_L$, which functions as a compensation control signal, is a function of Q6's drain-to-source resistance. Because the gate of Q6 is driven by the inferential sense signal used to control the reference circuit 64, the resistance of Q6 and therefore the voltage $V_L$ both vary as a function of the power amplifier AM modulation impedance.

A peak-detect-and-level-set circuit (gain control circuit) 74 in compensation controller 68 controls the modulation gain of current modulator 42 responsive to the compensation control signal ($V_L$) from detection circuit 66 to avoid voltage clipping. The gain control circuit 74 effects modulation gain control by generating a compensation signal to operate switches 78, such that various combinations of load resistors R1 . . . RN are selectively coupled to the feedback loop of the modulation control circuit 60.

That is, in this embodiment, the gain control circuit 74 translates detected voltage peaks into binary code words for operating switches 78 to avoid voltage clipping. This operation of gain control circuit 74 might be implemented in discrete logic, or may simply be implemented by logic resources available within the baseband processor 46. Indeed, the compensation controller 68 might forego the use of switches 78 in favor of a variable resistor, e.g., transistor load, responsive to detected peaks in $V_L$. Of course, many other variations exist for dynamically changing gain control responsive to inferentially sensed changes in power amplifier output impedance.

It may not be necessary for the gain controller 74 to perform dynamic, real-time compensation adjustment of the load resistors via switches 78. A scheduled intermittent update to adapt the settings of switches 78 may be performed often enough to compensate for changes to PA RF output impedance matching, temperature and process drift effects. For example, the gain controller 74 might adjust switches 78 to couple selected ones of load resistors $R_1 \ldots R_N$ to the feedback loop of the modulation control circuit 60 during a scheduled intermittent update period, possibly when the power amplifier 48 is not transmitting a RF signal. Such adjustments would be made based on a detected voltage peak of the compensation control signal $V_L$ relative to one or more defined voltage thresholds.

Figure 9:
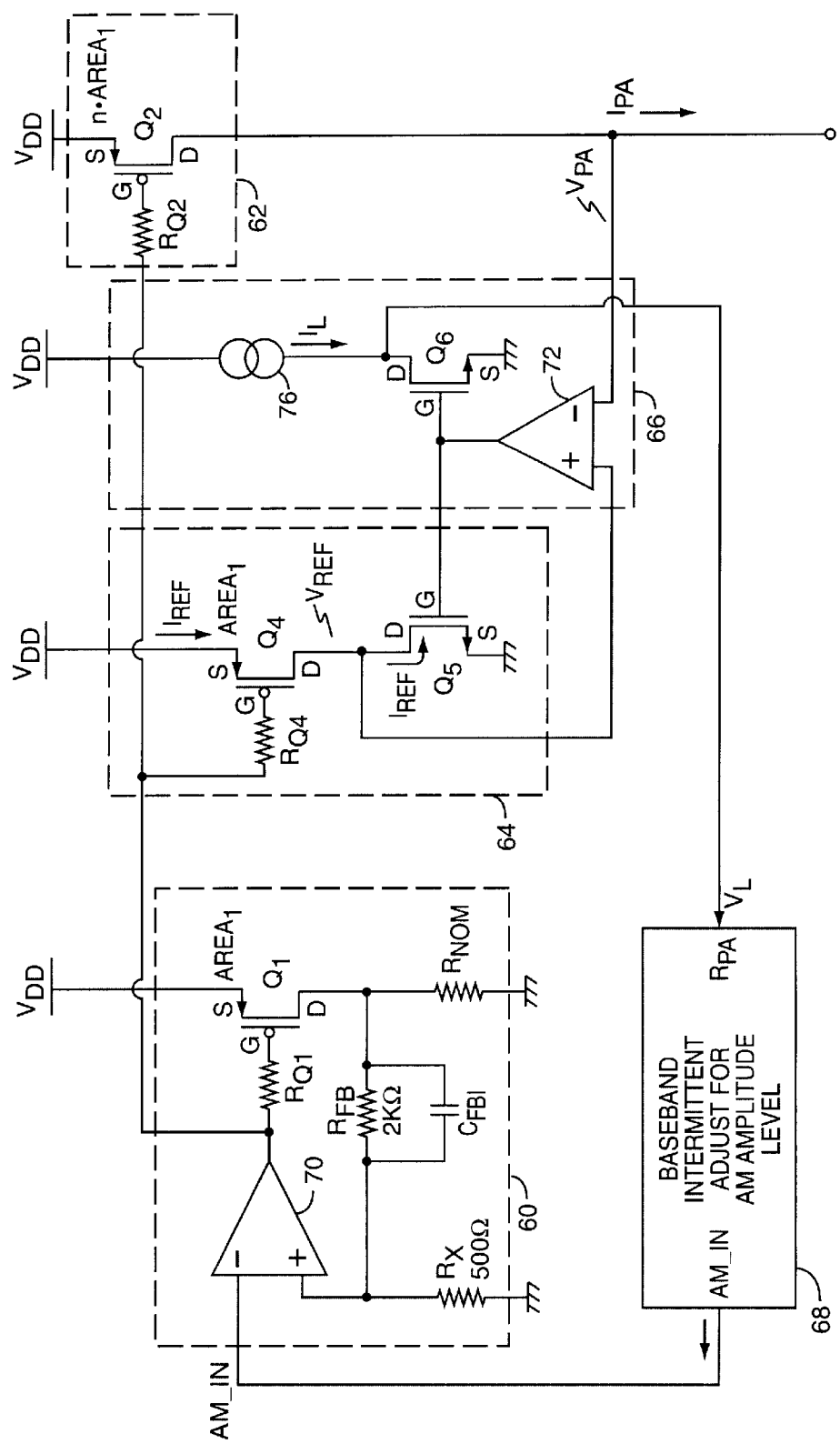
FIG. 9 is a diagram illustrating another exemplary embodiment of the current modulator where the modulation gain is varied responsive to inferentially sensed PA resistance to avoid voltage clipping.

FIG. 9 shows another embodiment of the current modulator 42 that uses the compensation controller 68 to avoid voltage clipping of the RF_OUT signal from power amplifier 48, but does so using a different approach. Here the compensation controller 68 comprises a processing circuit that adjusts the scale of the amplitude modulation signal AM_IN responsive to changes in the compensation control signal $V_L$. Thus, the amplitude modulation signal AM_IN is adjusted responsive to inferentially sensed changes in power amplifier AM modulation impedance. With this approach, the compensation controller 68 is advantageously implemented as part of the baseband processor 46, but may be implemented as stand-alone logic, or integrated elsewhere into the functionality of device 40.

In an exemplary embodiment, the baseband processor includes analog interface circuitry for determining the magnitude of the voltage $V_L$ and analog interface circuitry for generating the amplitude modulation signal AM_IN as an analog voltage waveform. In a typical embodiment, the baseband processor 46 further includes processing circuitry adapted to determine an appropriate setting or scale for the amplitude modulation signal AM_IN as a function of the magnitude of the voltage $V_L$. The baseband processor 46 may determine these settings on an intermittent basis, and thus the modulation gain of the current modulator 42 would be dynamically adjusted frequently enough to avoid voltage clipping of the RF_OUT signal at the power amplifier 48.

Figure 10:
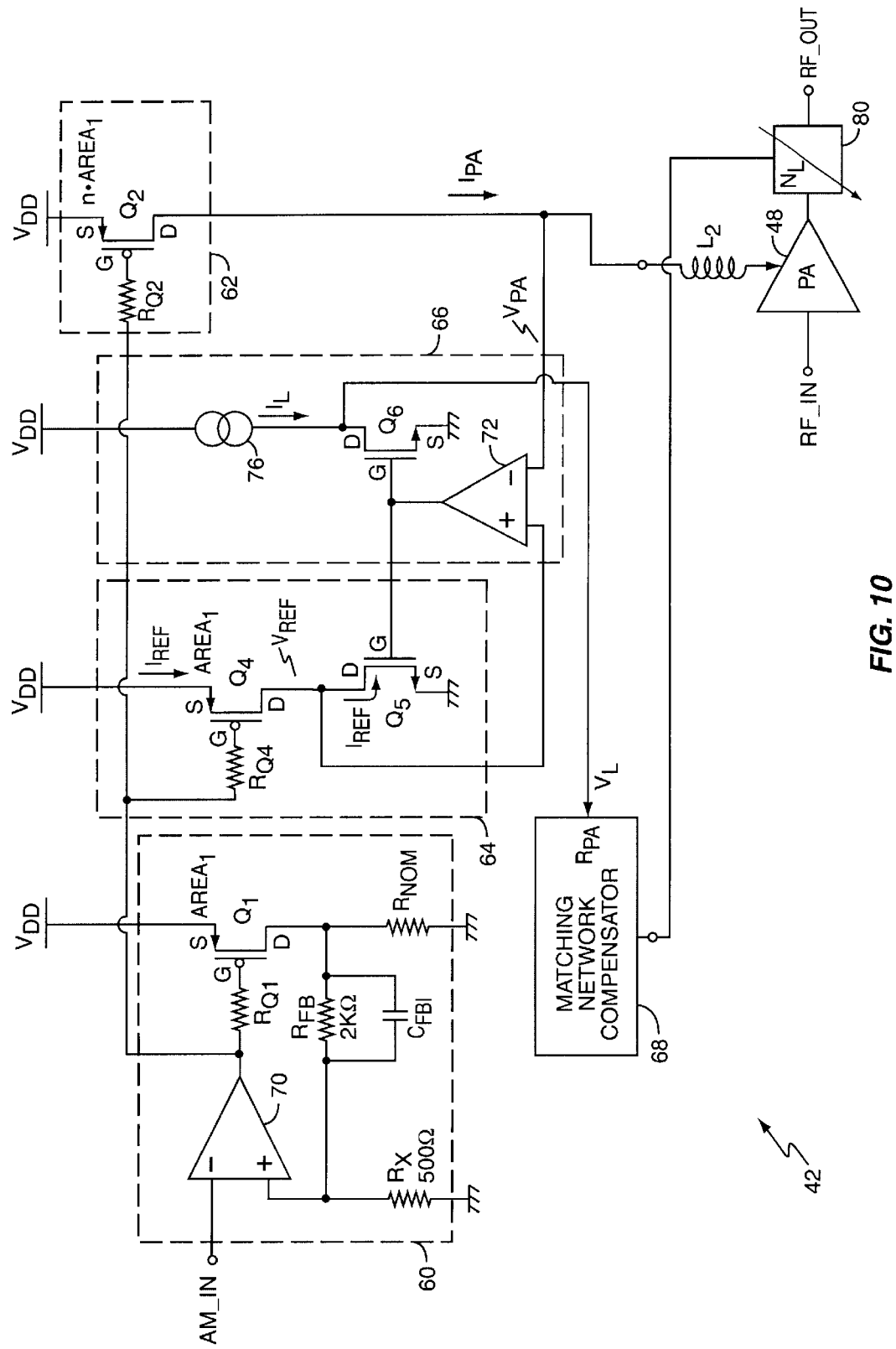
FIG. 10 is diagram illustrating another exemplary embodiment of the current modulator where a variable impedance matching network is controlled responsive to inferentially sensed PA AM modulation impedance to maintain PA impedance over change in antenna impedance.

FIG. 10 illustrates an embodiment of the current modulator 42 that departs from the gain control techniques of the previous embodiments by employing the compensation controller 68 to control the impedance of a variable matching network 80 that couples the power amplifier 48 to the antenna assembly 54. In this embodiment, the current modulator 42 effectively cancels out the affects of changing antenna impedance by dynamically adapting the impedance matching network 80 to sensed changes in antenna impedance. In operation, this action maintains the power amplifier 48 at its nominal DC resistance, thus avoiding the problems of voltage clipping that might otherwise arise with changes in antenna impedance.

Figure 11:
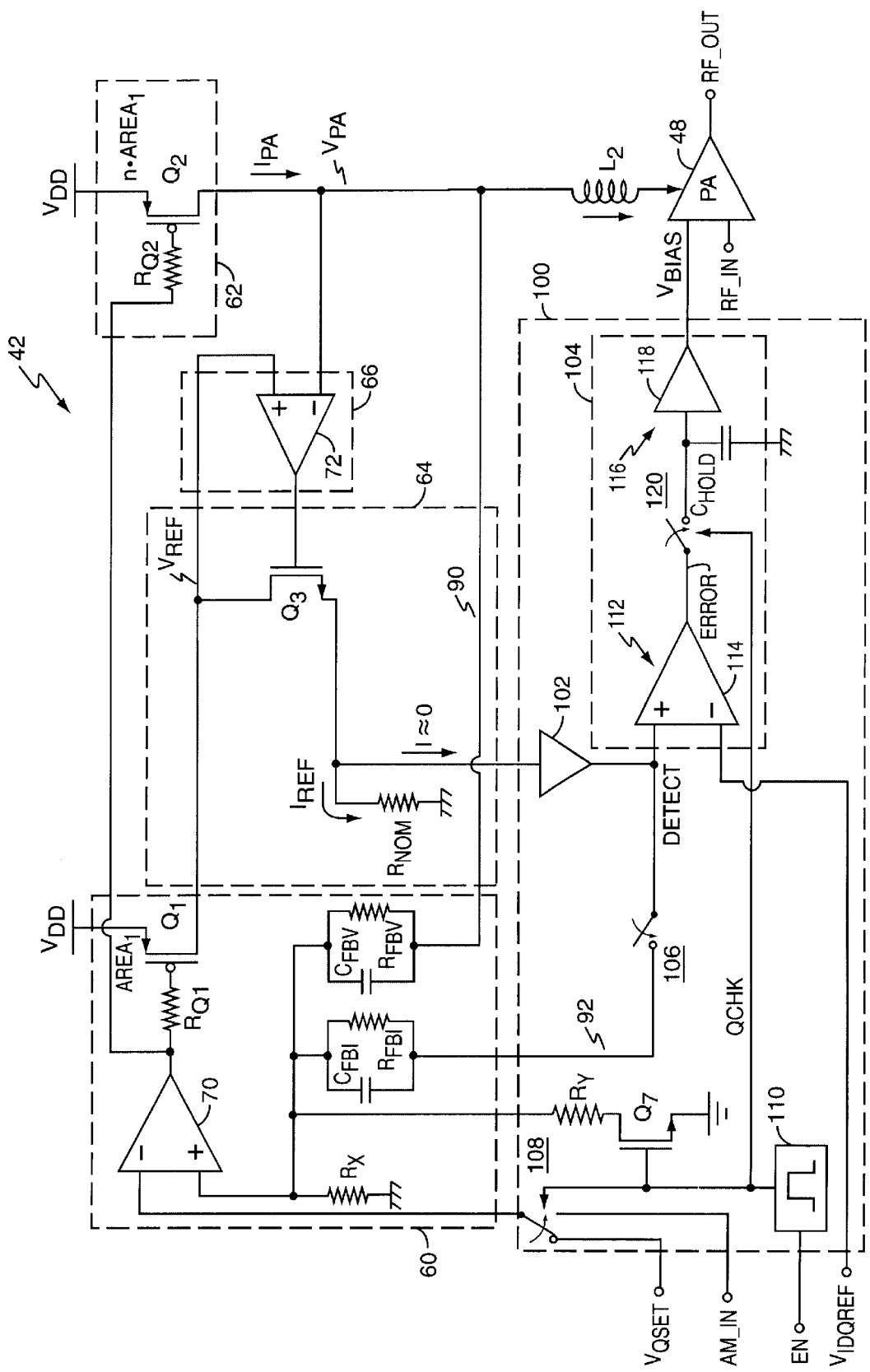
FIG. 11 is a diagram of another exemplary embodiment of the current modulator incorporating dynamic adjustment of power amplifier bias voltage.

FIG. 11 illustrates a return to the gain control techniques of some of the earlier embodiments of the current modulator 42, but represents a more complex circuit that uses both supply current and supply voltage modulation to impart amplitude modulation to the RF_OUT signal from the power amplifier 48. Further, in this embodiment, the current modulator 42 provides exemplary dynamic bias voltage control of the power amplifier 48. As those skilled in the art will readily understand, bias voltage control of power amplifier 48 is used to establish its quiescent current level, thereby establishing the transistor operating point at the desired region of operation in accordance with transmit signal output power. More details regarding the advantages of dynamic bias control are available in the co-pending and commonly assigned application entitled, "DYNAMIC BIAS CONTROLLER FOR POWER AMPLIFIER CIRCUITS," which is incorporated herein by reference in its entirety.

As was noted in the background discussion earlier, supply current modulation and supply voltage modulation each offer certain advantages, and each suffers from one or more disadvantages. For example, several of the above embodiments of the present invention use inferential sensing of the power amplifier AM modulation impedance to avoid the voltage clipping problems otherwise attendant to supply current modulation. Thus, the current modulator 42 offers the advantages of supply current modulation with the attendant disadvantages, and further enhances its operation by including supply voltage modulation and dynamic bias control.

Those readers interested in more details regarding supply voltage and/or supply current modulation may refer to application Ser. No. 09/738,971, filed on Dec. 14, 2000, and entitled "SYSTEM AND METHOD OF RF POWER AMPLIFICATION," application Ser. No. 09/813,593, filed on Mar. 21, 2001, and entitled "SYSTEM AND METHOD FOR CURRENT-MODE AMPLITUDE MODULATION," and application Ser. No. 09/813,741, filed on Mar. 21, 2001, and entitled "SYSTEM AND METHOD FOR RF SIGNAL AMPLIFICATION," all commonly assigned with the instant application, and all of which are incorporated herein by reference in their entireties.

In the embodiment of FIG. 11, the modulation control circuit 60, the reference circuit 64, and the detection circuit 66 operate similarly with the embodiment shown in, for example, FIG. 7. However, the feedback input of the differential amplifier 70 in the modulation control circuit 60 is driven by two feedback loops. More particularly, a first feedback loop 90 functions as voltage feedback loop, and is coupled to the modulated supply current output of the current modulator 42 through the parallel combination of capacitor $C_{FBV}$ and resistor $R_{FBV}$. Feedback loop 90 provides scaled feedback of the operating voltage $V_{PA}$ of the power amplifier 48 to the feedback input of amplifier 70 in the modulation control circuit 60. A second feedback loop 92 selectively couples the variable feedback voltage developed across $R_{NOM}$ of the reference circuit 64 through the parallel combination of capacitor $C_{FBI}$ and resistor $R_{FBI}$. While feedback loop 90 is associated with supply voltage modulation, feedback loop 92 is associated with supply current modulation, and its feedback signal varies with inferentially sensed power amplifier AM impedance as detailed above.

The bias controller 100 forms a part of the current modulator 42, and an amplifier 102 within the bias controller 100 buffers the variable feedback voltage across $R_{NOM}$ into a closed-loop control circuit 104. The closed-loop control circuit 104, that uses it at selected operating times to dynamically set the bias voltage output from the bias controller 100 at an optimum level so that the power amplifier 48 is biased at a desired level of quiescent current. A switch 106 selectively couples the buffered feedback voltage of feedback loop 92 to the feedback input of amplifier 70 through the parallel combination $C_{FBI}\|R_{FBI}$ when the bias controller 100 is not adjusting the bias voltage.

In more detail, the bias controller 100 additionally comprises a switch 108 for switching the signal input of the amplifier 70 from the amplitude modulation signal to a bias calibration reference voltage $V_{QSET}$, and a transistor Q7 and associated load resistor $R_Y$ for varying a feedback gain of the current modulator 42 during bias calibration. The closed-loop control circuit 104 comprises, at least in this exemplary embodiment, an amplifier circuit 112 comprising differential amplifier 114, and a track-and-hold circuit 116 comprising amplifier 118 and an analog storage element (e.g., $C_{HOLD}$).

The bias voltage $V_{BIAS}$ is calibrated in a first state of operation under quiescent current conditions, i.e., RF_IN to the power amplifier 48 is held to zero RF power. A rising edge on the enable signal EN causes the pulse controller 110 to generate a timed control pulse QCHK having a defined, relatively short duration, e.g., 15 μs, that is generally much shorter than the pulse width of the EN signal. Thus, if EN is asserted in advance of a radio transmit burst, QCHK operates as a short, self-ending bias voltage calibration pulse in advance of RF transmission.

In any case, during bias voltage calibration, QCHK opens switch 106, closes switch 108 to connect to $V_{QSET}$, closes switch 120, and turns on transistor 07, which also operates as a switch. Enabling Q7 switches in load resistor $R_Y$ to increase the gain of current modulator 42, thereby allowing quicker supply current settling during the relatively short pulse duration of QCHK. Closing switch 120 enables closed-loop feedback control of $V_{BIAS}$ to set supply current IPA under quiescent conditions by coupling the variable voltage feedback from Q3 to amplifier 114 through a buffer amplifier 102. Closing switch 120 places the track-and-hold circuit 116 into its track mode, such that $V_{BIAS}$ changes responsive to the error signal generated by amplifier 114.

The error signal generated by amplifier 114 is a function of the feedback voltage developed across $R_{NOM}$, which depends on the level of actual supply current $I_{PA}$ into the power amplifier 48, and on a bias adjustment reference voltage $V_{IDQREF}$, which is representative of a desired or target bias voltage. Thus, the bias voltage $V_{BIAS}$ is adjusted up or down under closed-loop control until the supply current into the power amplifier 48 equals the desired quiescent current value.

Such adjustment happens in advance of QCHK being de-asserted, at which time, the bias controller 100 transitions into a second state of operation, where it holds the adjusted bias voltage, and returns gain control of the current modulator 42 to its default gain control. More particularly, when QCHK is de-asserted, bias controller 100 switches $R_Y$ out of the feedback loop of the modulation control circuit 70, couples feedback loop 92 to the feedback input of amplifier 70, and couples the AM_IN signal to the input of amplifier 70.

In an operational variation, the circuit of FIG. 11 may use adjustments to the quiescent current reference voltage VIDQREF to control the output power from the power amplifier 48. As a first step, the bias calibration pulse QCHK is made equal to, or replaced by, the transmit burst enable pulse EN. Thus, the bias controller 100 remains in its first state (adjustment condition) in advance of and throughout the RF transmit burst. In this state, the AM_IN signal is not applied to the modulation control circuit 60, thus supply modulation control becomes a function of bias voltage control dependent on manipulating $V_{IDQREF}$.

One application of such control is GSM burst power control, where RF power is ramped up, held at a desired level for a modulation period, and then ramped down, all in accordance with a power mask that defines allowable RF output power during all phases of the transmit burst. In this context, the bias controller 100 is held in its first state, where $V_{BIAS}$ moves under closed-loop control responsive to sense supply current IPA and the quiescent current reference voltage $V_{IDQREF}$. Baseband processor 46, or other processing circuit, can be used to dynamically control $V_{IDQREF}$ to effect the desired RF output power control of power amplifier 48. The reader is the earlier incorporated co-pending application, "DYNAMIC BIAS CONTROLLER FOR POWER AMPLIFIER CIRCUITS," for additional GSM transmit burst details.

From the number and complexity of the various embodiments discussed above, those skilled in the art will appreciate that the present invention is subject to much variation. In general, however, the present invention provides for inferential sensing of power amplifier AM modulation impedance in a current modulation environment using sensing techniques that do not result in the dissipation of power amplifier supply power or RF output power. As such, the foregoing embodiments are exemplary rather than limiting. Indeed, the present invention is limited only by the scope of the following claims and the reasonable equivalents thereof.

What is claimed is:

1. A current modulator to supply a modulated supply current to a power amplifier responsive to an amplitude modulation signal, the current modulator comprising:

a modulation control circuit generating a modulation control signal responsive to the amplitude modulation signal;

an output circuit generating the modulated supply current responsive to the modulation control signal;

a reference circuit generating a reference current proportional to the modulated supply current, and including a reference control element responsive to an inferential sense signal to maintain the reference current at a known proportionality relative to the modulated supply current; and a detection circuit generating the inferential sense signal as a function of an operating voltage of the power amplifier and the reference current such that the inferential sense signal varies in dependence on power amplifier (PA) AM modulation impedance.

2. The current modulator of claim 1, wherein the output circuit comprises an output transistor deriving the modulated supply current from a supply voltage responsive to the modulation control signal.

3. The current modulator of claim 2, wherein the reference circuit includes a reference transistor controlling the reference current responsive to the modulation control signal, and having a known geometric scaling relative to the output transistor.

4. The current modulator of claim 3 wherein the reference control element controls an operating condition of the reference transistor to vary identically with a corresponding operating condition of the output transistor, such that the reference current is maintained at the known proportionality relative to the modulated supply current.

5. The current modulator of claim 4 wherein the reference control element controls an operating voltage of the reference transistor.

6. The current modulator of claim 5, wherein the reference control element comprises a control transistor disposed in series with the reference transistor, and configured as a variable resistor responsive to the inferential sense signal, to vary the operating voltage of the reference transistor with changes in a corresponding operating voltage of the output transistor such that the operating voltage of the reference transistor remains equal to operating voltage of the output transistor.

7. The current modulator of claim 6 wherein the operating voltage of the reference transistor is generated by the reference current.

8. The current modulator of claim 6, wherein the reference transistor includes a first signal terminal coupled to the supply voltage, a second signal terminal coupled to the control transistor, and a control terminal coupled to the modulation control circuit such that the reference transistor varies the reference current responsive to the modulation control signal.

9. The current modulator of claim 8 wherein the control transistor controls the operating voltage of the reference transistor at the second signal terminal.

10. The current modulator of claim 9, wherein the output transistor includes a first signal terminal coupled to a supply voltage, a second signal terminal coupled to a supply input of the power amplifier, and a control terminal coupled to the modulation control circuit such that the reference transistor varies the reference current responsive to the modulation control signal.

11. The current modulator of claim 10 wherein the operating voltage of the reference transistor is equal to the supply voltage to the power amplifier.

12. The current modulator of claim 6, wherein the detection circuit comprises a differential amplifier circuit connected between the output circuit and the reference circuit to generate the inferential sense signal based on a difference between the operating voltage of the reference transistor and the operating voltage of the output transistor.

13. The current modulator of claim 12, wherein the differential amplifier circuit includes a feedback loop closed through the reference control element such that the variable resistor varies responsive to changes in the PA resistance.

14. The current modulator of claim 6, wherein the modulation control circuit comprises a differential amplifier circuit generating the modulation control signal based on the difference between a feedback voltage derived from the operating voltage of the reference transistor and the amplitude modulation signal.

15. The current modulator of claim 14, wherein a feedback loop of the differential amplifier circuit is closed around the reference control element such that a control gain of the differential amplifier varies as a function of the PA AM modulation impedance.

16. The current modulator of claim 1 wherein the detection circuit generates a compensation control signal that varies with changes in power amplifier AM modulation impedance.

17. The current modulator of claim 16 further comprising a compensation controller responsive to the compensation control signal from the detection circuit to generate a compensation signal that compensates for changes in power amplifier AM modulation impedance.

18. The current modulator of claim 17 wherein the compensation controller comprises a modulation gain control circuit to vary a modulation gain of the modulation circuit responsive to the compensation signal.

19. The current modulator of claim 18 wherein the modulation gain control circuit comprises a peak detector to generate the compensation signal responsive to the compensation control signal and a resistor network coupled to the modulation control circuit to provide a variable effective resistance to the modulation control circuit responsive to the compensation signal from the peak detector.

20. The current modulator of claim 17 wherein the compensation controller controls scaling of the amplitude modulation signal responsive to the compensation control signal.

21. The current modulator of claim 17 wherein the compensation control circuit generates a compensation signal to adjust the impedance of a matching network coupled to the output of the power amplifier.

22. The current modulator of claim 1, further comprising a bias controller to generate a bias voltage for biasing the power amplifier such that quiescent supply current provided to the power amplifier by the current modulator under quiescent conditions equals a desired quiescent current value.

23. The current modulator of claim 22, wherein the bias controller comprises:
 a detection circuit to generate a sense signal proportional to quiescent supply current into the power amplifier;
 a closed loop control circuit to adjust the bias voltage applied to the power amplifier such that the quiescent supply current equals the desired quiescent current value.

24. The current modulator of claim 23, wherein the closed loop control circuit of the bias controller comprises:
 an error amplifier to generate an error signal based on a difference between the sense signal and a quiescent current reference voltage representing the desired quiescent current value; and
 a track-and-hold circuit adjusting the bias voltage responsive to the error signal in a first state, and holding an adjusted level of the bias voltage in a second state irrespective of the error signal.

25. The current modulator of claim 24, wherein the bias controller further comprises a timing function generating a bias calibration pulse, and wherein the track-and-hold circuit operates in one of the first and second states in dependence upon the bias calibration pulse.

26. The current modulator of claim 25, wherein the bias controller further comprises an input control switch responsive to the bias calibration pulse to decouple the current modulation control circuit from the amplitude modulation signal during adjustment of the bias voltage.

27. The current modulator of claim 25, wherein the bias controller further comprises a gain control circuit to selectively adapt the modulation control gain of the current modulator to facilitate bias voltage adjustment.

28. The current modulator of claim 25, wherein the gain control circuit is responsive to the bias calibration pulse such that the modulation control gain of the current modulator is adapted during the bias calibration pulse.

29. The current modulator of claim 25, wherein the current modulator includes a first feedback loop coupling a feedback control input of the modulation control circuit to an output of the current modulator, such that the first feedback loop provides supply voltage modulation feedback, and further includes a second feedback loop coupling the feedback control input of the modulation control circuit to a feedback voltage in the reference circuit responsive to the reference current, such that the second feedback loop provides supply current modulation feedback.

30. The current modulator of claim 29, wherein the bias controller further includes a feedback switching circuit for selectively decoupling the second feedback loop from the current modulation control circuit during the bias calibration pulse.

31. The current modulator of claim 24, wherein the bias controller includes switching circuits responsive to a transmit enable pulse, such that the modulation control circuit is de-coupled from the amplitude modulation signal during assertion of the transmit enable pulse.

32. The current modulator of claim 31, wherein the switching circuits further enable the track-and-hold circuit during assertion of the transmit enable pulse to allow dynamic adjustment of the bias voltage responsive to differences between the quiescent current reference voltage and the detection signal during RF transmit operations.

33. The current modulator of claim 32, further comprising a quiescent current reference voltage controller to dynamically control RF transmit power during the transmit operations by dynamically controlling a magnitude of the quiescent current reference voltage.

34. In a current modulator supplying a modulated current to a power amplifier, a method of inferentially sensing power amplifier (PA) AM modulation impedance in a current modulator where a power amplifier is supplied with a modulated supply current, the method comprising:

generating said modulated supply current in an output circuit responsive to an amplitude modulation signal;

generating a reference current in a reference circuit proportional to the modulated supply current; and slaving an operating voltage of the reference circuit generated by the reference current to an operating voltage of power amplifier such that the reference current is maintained at a known proportionality relative to the modulated supply current irrespective of changes in the PA AM modulation impedance; and generating an inferential sense signal as a function of the operating voltage of the power amplifier and the reference current.

35. The method of claim 34 wherein slaving an operating voltage of the reference circuit generated by the reference current to an operating voltage of power amplifier comprises controlling an operating voltage of the reference circuit so as to maintain a fixed relation between the operating voltage of the reference circuit and a corresponding operating voltage in the output circuit that is dependent on the operating voltage of the power amplifier.

36. The method of claim 35 wherein slaving an operating voltage of the reference circuit generated by the reference current to an operating voltage of power amplifier further comprises varying a resistance in the reference circuit responsive to the inferential sense signal.

37. The method of claim 36 wherein varying a resistance in the reference circuit responsive to the inferential sense signal comprises configuring a control transistor as a variable resistor responsive to the inferential sense signal such that the effective resistance of the control transistor varies responsive to the operating voltage of the power amplifier.

38. The method of claim 34 wherein generating an inferential sense signal as a function of an operating voltage of the power amplifier and the reference current comprises generating the inferential sense signal in a differential amplifier circuit based on a difference between the operating voltage of the reference circuit to the operating voltage of the output circuit.

39. The method of claim 34 wherein generating the modulated supply current in an output circuit responsive to an amplitude modulation signal comprises generating a modulation control signal in a modulation control circuit and coupling the modulation control circuit to the output circuit such that the output circuit varies the modulated supply current responsive to the modulation control signal.

40. The method of claim 39 wherein generating a modulation control signal in a modulation control circuit comprises generating the modulation control signal in a differential amplifier circuit based on a difference between the amplitude modulation signal and a feedback signal derived from the operating voltage of the reference circuit.

41. The method of claim 40 further comprising varying a resistance of the reference circuit responsive to the inferential sense signal to maintain a fixed control gain in the modulation control circuit irrespective of changes in the PA AM modulation impedance of the power amplifier.

42. The method of claim 34 further comprising generating a compensation control signal responsive to changes in the AM modulation impedance of the power amplifier.

43. The method of claim 42 further comprising varying a modulation gain of the current modulator responsive to the compensation control signal to compensate for changes in PA AM modulation impedance.

44. The method of claim 43 wherein varying a modulation gain of the current modulator responsive to the inferential sense signal comprises varying a resistance of the current modulator to change the modulation gain of the current modulator.

45. The method of claim 42 further comprising adjusting an impedance of a matching network coupled to an output of the power amplifier responsive to the compensation control signal.

46. The method of claim 34 further comprising scaling the amplitude modulation signal responsive to the inferential sense signal.

47. A current modulator to supply a modulated supply current to a power amplifier responsive to an amplitude modulation signal, the current modulator comprising:

an output circuit generating the modulated supply current responsive to the amplitude modulation signal;

a reference circuit generating a reference current proportional to the modulated supply current, said reference circuit including an operating voltage generated by the reference current and slaved to an operating voltage of the power amplifier such that the reference current is maintained at a known proportionality relative to the modulated supply current; and a detection circuit generating an inferential sense signal as a function of an operating voltage of the power amplifier and the reference current such that the inferential sense signal varies in dependence on power amplifier (PA) impedance.

48. The current modulator of claim 47 wherein the reference circuit comprises a reference control element responsive to the inferential sense signal to vary a resistance within the reference current.

49. The current modulator of claim 48 wherein the reference control element comprises a reference control transistor in the reference circuit configured as a variable resistor.

50. The current modulator of claim 47 wherein the output circuit includes an output transistor controlling the modulated supply current responsive to the amplitude modulation signal, and wherein the reference circuit includes a reference transistor controlling the reference current responsive to the amplitude modulation signal, and wherein the reference transistor has a known geometric scaling relative to the output transistor.

51. The current modulator of claim 50 wherein the reference control circuit further comprises a reference control element to maintain the operating conditions of the reference transistor the same as the operating conditions of the output transistor.

52. The current modulator of claim 51 wherein the operating voltage of the reference circuit comprises the drain voltage of the reference transistor.

53. The current modulator of claim 52 wherein the reference control element operates to maintain the drain voltage of the reference transistor equal to the drain voltage of the output transistor.

54. The current modulator of claim 53 wherein the drain voltages of the output transistor and the reference transistor both equal the operating voltage of the power amplifier.

55. The current modulator of claim 51 wherein the reference control element comprises a reference control transistor configured as a variable resistor.

56. The current modulator of claim 55 wherein the reference control transistor is connected in series with the reference transistor.

57. The current modulator of claim 47 wherein the operating voltage of the reference circuit equals the operating voltage of the power amplifier.

58. The current modulator of claim 47 wherein the detection circuit comprises a differential amplifier circuit connected between the output circuit and the reference circuit generating the inferential sense signal based on a difference between the operating voltage of the reference circuit and a corresponding operating voltage in the output circuit dependent on the power amplifier voltage.

59. The current modulator of claim 58 wherein the operating voltage of the reference circuit and the operating voltage of the output circuit are both equal to the operating voltage of the power amplifier.

60. The current modulator of claim 47 further comprising a modulation control circuit generating a modulation control signal responsive to the amplitude modulation signal, and wherein the modulation control circuit is coupled to the output circuit such that the output circuit controls the modulated supply current responsive to the modulation control circuit from the modulation control circuit.

61. The current modulator of claim 60 wherein the modulation control circuit is coupled to the reference circuit such that the reference signal is controlled responsive to the modulation control signal.

62. The current modulator of claim 61 wherein the modulation control circuit comprises a differential amplifier circuit comparing the amplitude modulation signal to a feedback signal derived from the operating voltage of the reference circuit.

63. The current modulator of claim 62 wherein feedback signal varies responsive to the inferential sense signal such that the control gain of the modulation control circuit remains fixed irrespective of changes in PA AM modulation impedance of the power amplifier.

64. The current modulator of claim 51 wherein the detection circuit generates a compensation control signal responsive to changes in PA AM modulation impedance of the power amplifier.

65. The current modulator of claim 64 further comprising a compensation controller circuit responsive to the compensation control signal to vary a modulation gain of the current modulator responsive to the compensation control signal to compensate for changes in power amplifier PA AM modulation impedance.

66. The current modulator of claim 65 wherein the gain controller varies a resistance of the current modulator to adjust the modulation gain.

67. The current modulator of claim 65 wherein the gain controller varies a scaling of the amplitude modulation signal to adjust the modulation gain.

68. The current modulator of claim 64 further comprising a compensation controller circuit responsive to the compensation control signal to adjust an impedance of a matching network coupled to an output of the power amplifier responsive to the compensation control signal.

* * * * *